United States Patent
Shojaie

(10) Patent No.: US 10,204,884 B2
(45) Date of Patent: Feb. 12, 2019

(54) MULTICHIP PACKAGING FOR DICE OF DIFFERENT SIZES

(71) Applicant: Intel Corporation, Santa Clara, CA (US)

(72) Inventor: Saeed S. Shojaie, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/197,494

(22) Filed: Jun. 29, 2016

(65) Prior Publication Data

US 2018/0005990 A1 Jan. 4, 2018

(51) Int. Cl.
*H01L 25/04* (2014.01)
*H01L 25/07* (2006.01)
(Continued)

(52) U.S. Cl.
CPC .......... *H01L 25/0657* (2013.01); *H01L 25/50* (2013.01); *H01L 25/043* (2013.01); *H01L 25/0756* (2013.01); *H01L 25/117* (2013.01); *H01L 2224/023* (2013.01); *H01L 2225/06506* (2013.01); *H01L 2225/06544* (2013.01);
(Continued)

(58) Field of Classification Search
CPC ... H01L 25/0657; H01L 25/50; H01L 25/043; H01L 25/0756; H01L 25/117; H01L 2224/023
See application file for complete search history.

(56) References Cited

U.S. PATENT DOCUMENTS

| 7,560,818 B2 * | 7/2009 | Tsai | H01L 24/32 257/686 |
| 7,825,520 B1 * | 11/2010 | Longo | H01L 24/19 257/686 |

(Continued)

FOREIGN PATENT DOCUMENTS

| WO | 2009022991 A1 | 2/2009 |
| WO | WO2016049940 A1 | 4/2016 |

OTHER PUBLICATIONS

Guilian Goa, "Manufacturing Readiness of BVA® Technology for Fine-Pitch Package-on-Package," International Microelectronics Assembly and Packaging Society, Invensas Corp, (2015), 32 pages.

(Continued)

*Primary Examiner* — Ida M Soward
(74) *Attorney, Agent, or Firm* — Schwabe, Williamson & Wyatt, P.C.

(57) ABSTRACT

Apparatuses, methods and storage medium associated with integrated packaging for a stack of semiconductor dice of different sizes are disclosed herein. In embodiments, an apparatus including dice of different sizes may include a first die having a first side and a second side opposite the first side and a second smaller die having a first side and a second side opposite the first side the second side. The second side of the first die may be smaller than the first side of the second die and may be coupled thereto such that a portion of the first side of the second die is exposed. The apparatus may include wires coupled with and extending from the portion of the first side of the second die through a casing to a redistribution layer coupled with a side of the casing, to electrically couple the dice. Other embodiments may be disclosed and/or claimed.

8 Claims, 6 Drawing Sheets

(51) Int. Cl.
*H01L 25/11* (2006.01)
*H01L 25/065* (2006.01)
*H01L 25/00* (2006.01)
*H01L 25/075* (2006.01)

(52) U.S. Cl.
CPC ............ *H01L 2225/06568* (2013.01); *H01L 2225/06586* (2013.01)

(56) References Cited

U.S. PATENT DOCUMENTS

| | | | |
|---|---|---|---|
| 8,531,032 B2* | 9/2013 | Yu | H01L 23/3114 257/738 |
| 8,754,514 B2* | 6/2014 | Yu | H01L 23/49816 257/686 |
| 8,829,674 B2* | 9/2014 | Ayotte | H01L 24/81 257/737 |
| 8,896,109 B2* | 11/2014 | Pagaila | H01L 25/16 257/678 |
| 9,355,963 B2* | 5/2016 | Kim | H01L 21/486 |
| 9,583,456 B2* | 2/2017 | Uzoh | H01L 24/97 |
| 9,773,757 B2* | 9/2017 | Yu | H01L 25/0657 |
| 9,825,010 B2* | 11/2017 | Fang | H01L 25/0657 |
| 9,917,072 B2* | 3/2018 | Yu | H01L 25/0652 |
| 10,008,469 B2* | 6/2018 | Katkar | H01L 24/49 |
| 2006/0087013 A1* | 4/2006 | Hsieh | H01L 25/0652 257/678 |
| 2008/0251939 A1 | 10/2008 | Chung et al. | |
| 2010/0193930 A1* | 8/2010 | Lee | H01L 23/49816 257/686 |
| 2011/0068427 A1 | 3/2011 | Paek et al. | |
| 2011/0223721 A1* | 9/2011 | Cho | H01L 21/565 438/127 |
| 2011/0316117 A1* | 12/2011 | Kripesh | H01L 21/3121 257/531 |
| 2012/0038064 A1* | 2/2012 | Camacho | H01L 24/29 257/777 |
| 2013/0040423 A1* | 2/2013 | Tung | H01L 23/3114 438/107 |
| 2014/0217604 A1 | 8/2014 | Chou et al. | |
| 2015/0001727 A1* | 1/2015 | Lee | H01L 24/85 257/769 |
| 2015/0348940 A1* | 12/2015 | Woychik | H01L 25/065 257/774 |
| 2015/0357309 A1* | 12/2015 | Liu | H01L 25/50 257/692 |
| 2015/0380377 A1 | 12/2015 | Uzoh et al. | |
| 2016/0049390 A1* | 2/2016 | Uzoh | H01L 23/5384 438/107 |
| 2016/0155695 A1* | 6/2016 | Shen | H01L 23/315 257/676 |
| 2016/0211237 A1* | 7/2016 | Sato | H01L 23/13 |
| 2016/0247784 A1* | 8/2016 | Wang | H01L 24/19 |
| 2017/0117231 A1* | 4/2017 | Awujoola | H01L 23/552 |
| 2017/0125377 A1* | 5/2017 | Lou | H01L 25/0652 |
| 2017/0194292 A1* | 7/2017 | Yu | H01L 21/4853 |
| 2017/0287870 A1* | 10/2017 | Fang | H01L 25/0652 |
| 2017/0330858 A1* | 11/2017 | Lee | H01L 25/0652 |
| 2018/0145055 A1* | 5/2018 | Zhao | H01L 25/00 |

OTHER PUBLICATIONS

Rajesh Katkar et al., "Manufacturing Readiness of Bond Via Array (BVA™) Technology for Fine-Pitch Package-on-Package (POP)," Burn-in & Test Strategies Workshop, Invensas Corp, (2014), 28 pages.

Min-Tih Ted Lai et al., "Die Stack With Cascade and Vertical Connections", International Application No. PCT/US2015/063346, filed Dec. 2, 2015, 38 pages.

International Search Report and Written Opinion dated Aug. 30, 2017 for International Application No. PCT/US2017/034836, 14 pages.

\* cited by examiner

MULTICHIP PACKAGING FOR DICE OF DIFFERENT SIZES

TECHNICAL FIELD

The present disclosure relates to technology for multichip packaging for dice of different sizes.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Flip chip and/or TSV (through-silicon via) technologies may be used for a multichip package (MCP). However, to avoid design complexity and/or costs associated with flip chip and/or TSV technologies, or for other reasons, wirebond may be preferred. In a typical wirebond example, a multichip package (MCP) may utilize a printed circuit board (PCB). Bond fingers on the PCB may be arranged around one or more chips on the PCB to provide contact points corresponding to an external device. Wires may be draped from a surface of a chip that is elevated with respect to the surface of the PCB, down to the bond fingers.

As bonding density (number of bond wires) increases, the amount of clearance required between the draped wires (to avoid shorting) may become unworkable and/or the size of the bond fingers of the PCB may need to be large to enable the necessary wires to be connected to the substrate, which may affect package xy dimensions. Also, in a multitier scenario (i.e. a stack of dice), there may be no option to bond out pads on a tier farthest from the PCB before bonding out all of the pads on a tier closer to the PCB.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
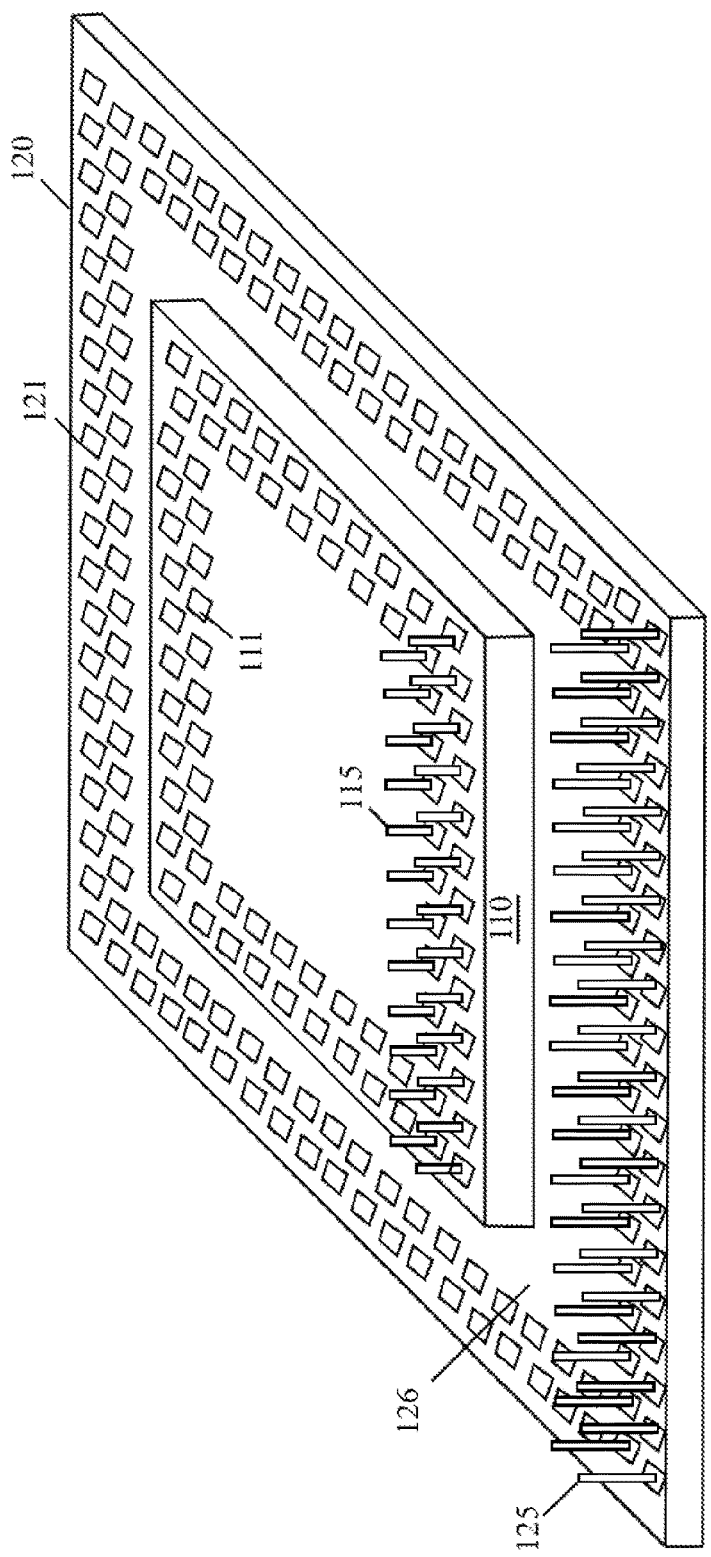
FIG. 1 illustrates dice of a multichip package for dice of different sizes, according to various embodiments.

Apparatuses, methods and storage medium associated with integrated packaging for a stack of semiconductor dice of different sizes are disclosed herein. In embodiments, an apparatus including dice of different sizes may include a first die having a first side and a second side opposite the first side and a second smaller die having a first side and a second side opposite the first side the second side. The second side of the first die may be smaller than the first side of the second die and may be coupled thereto such that a portion of the first side of the second die is exposed. The apparatus may include wires coupled with and extending from the portion of the first side of the second die through a casing to a redistribution layer (RDL) coupled with a side of the casing, to electrically couple the dice. In some embodiments, the apparatus may include wires coupled with an extending from the first side of the first die through the casing to the RDL. Other embodiments may be disclosed and/or claimed.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a die 110 and a die 120 of a multichip package 100 for dice of different sizes, according to various embodiments. A side of the first die 110 may be coupled to a larger side of the second die 120 such that a portion 126 of the side of the second die 120 may be exposed.

Wires 125 may be coupled with and extending from this exposed portion 126 of the side of the second die 120, for instance wires 125 may be bonded to pads 121 on the exposed portion 126 of the side of the second die 120. Shorter wires 115 may extend from a side of the first die 110 that is opposite to the coupled side, for instance wires 115 may be bonded to pads 111 on the first die 110. Only some of the wires 115 and 125 are illustrated for brevity; however, it should be appreciated that the wires 115 and 125 may be formed on some, e.g., all, of the pads 111 and 121.

Figure 2:
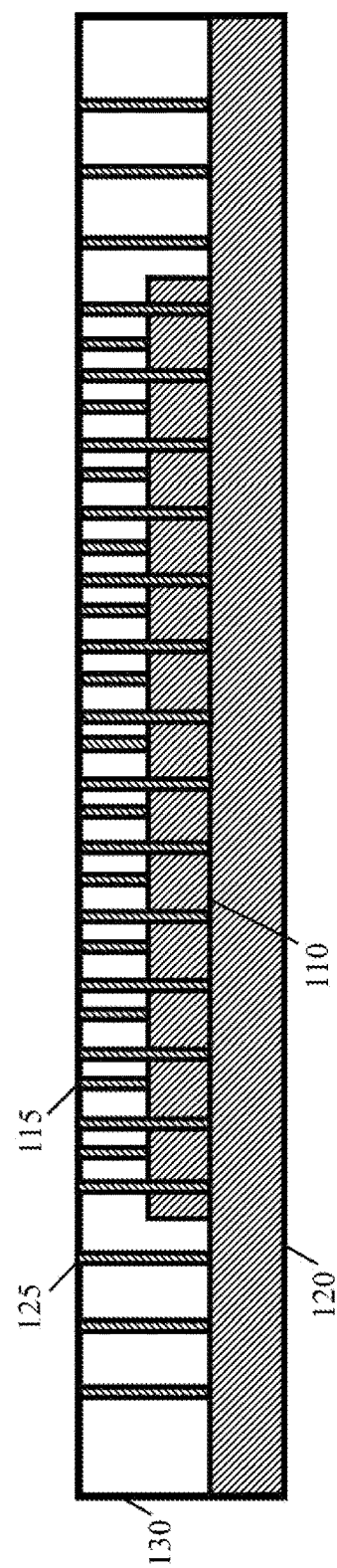
FIG. 2 illustrates a cross-sectional view of an example of the multichip package of FIG. 1 including a casing surrounding wires extending from surfaces of the chips, according to various embodiments.

Referring now to FIG. 2, a cross-sectional view of an example of the multichip package 100 of FIG. 1 is illustrated. A casing 130 surrounds the wires 115 and 125 and may cover the exposed portion of the side of the second die 120 and the side of the first die 110 from which the wires 115 extend.

In the illustrated embodiment, the casing 130 does not cover a side of the second die 120 that is opposite the side of the exposed portion of the second die 120. However, in other embodiments the casing may cover sides corresponding to both ends of the stack.

Figure 3:
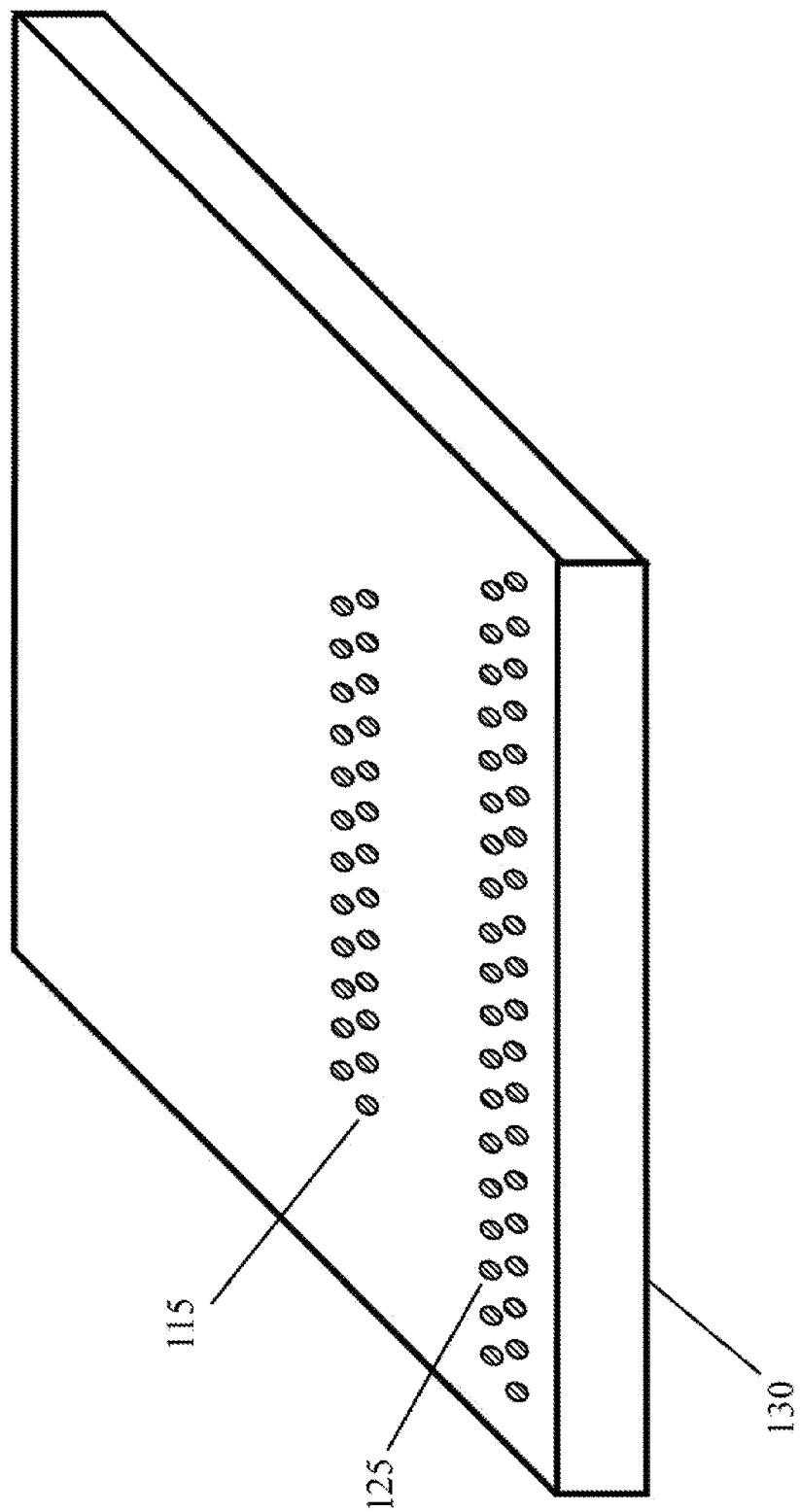
FIG. 3 illustrates an isometric view of the example of FIG. 2 showing ends of the wires exposed by the casing, according to various embodiments.

Referring now to FIG. 3, an isometric view of the example of FIG. 2 showing ends of the wires 115 and 125 exposed by the casing 130 is illustrated. In some embodiments, a portion of the casing 130 may be removed to expose the ends of the wires 115 and 125. As with FIG. 1, where only some of the wires 115 and 125 are illustrated for brevity, only some of the exposed ends of the wires 115 and 125 are illustrated for brevity.

In some embodiments, a grinding process may be applied to the casing 130 to make the casing and the ends of the wires 115 and 125 coplanar. However, in other embodiments the portion of the casing 130 may be removed using any removal process such as chemical etching, plasma etching, grinding, or the like, or combinations thereof.

Figure 4:
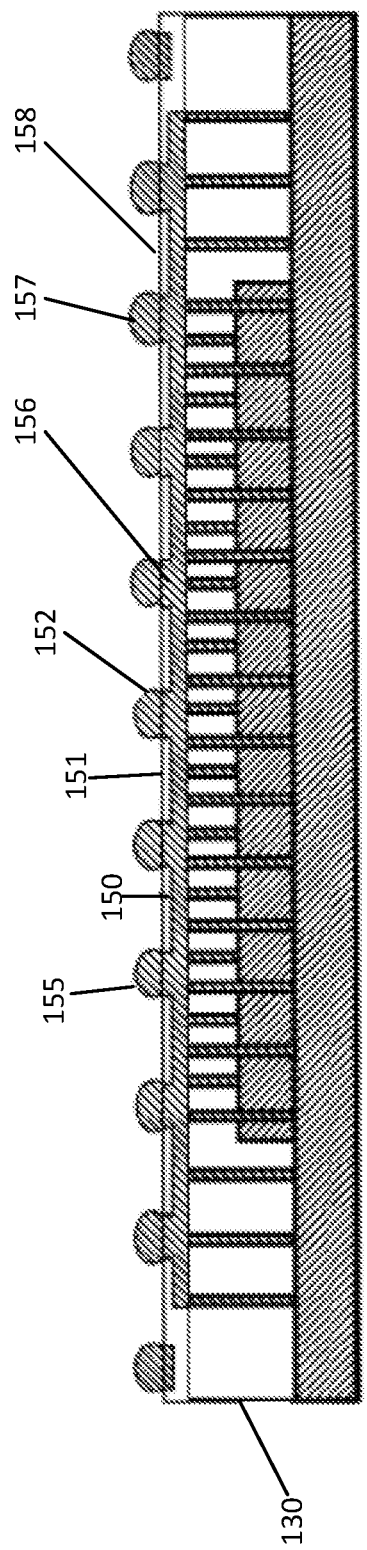
FIG. 4 illustrates a cross-sectional view of an example of FIG. 3 including a redistribution layer (RDL) coupled to the ends of the wires, according to various embodiments.

Referring now to FIG. 4, a cross-sectional view of an example of FIG. 3 including a redistribution layer (RDL) 150 coupled to the ends of the wires 115 and 125 is illustrated. In redistribution layer technology, additional circuitry may be formed on a wafer post wafer manufacturing, which may enable routing of electrical signals from one location to another on top of the wafer. In some examples, redistribution layer technology may utilize extra metal layers (typically one to two layers) in combination with dielectric layers. Metal and dielectric layers may be interweaved to keep the electrical circuits on top metal layer electrically isolated from the bottom metal layer. Some redistribution layers include an additional metal layer on an integrated circuit that makes contacts of the integrated circuit, e.g., I/O (input/output) pads of the integrated circuit, available in other locations.

The RDL 150 may be formed using any redistribution layer technology (e.g., currently available, or later developed). The RDL 150 may provide chip-to-chip interconnects to couple selected connections of the first die 110 to selected connections of the second die 120. The RDL 150 may provide device-to-device interconnects via an external interface of the multichip package. For instance, a first device having the multichip package may be coupled to an external second device via an external interface of the first device. The external interface of the first device may be the RDL 150 and/or a structure formed on the RDL 150, such as solder balls 155 or some other structure to bring connections of the RDL 150 out of the multichip package for interface to an external device. In some embodiments, the RDL 150 may include conductive regions 152 coplanar with a dielectric layer 151, and the solder balls 155 may be on these conductive regions 152. Specifically, conductive regions may comprise protrusions 156 with respective surfaces 157 configured to receive the solder balls 155, wherein the surfaces 157 are coplanar with a surface 158 of the dielectric layer 151.

Figure 5:
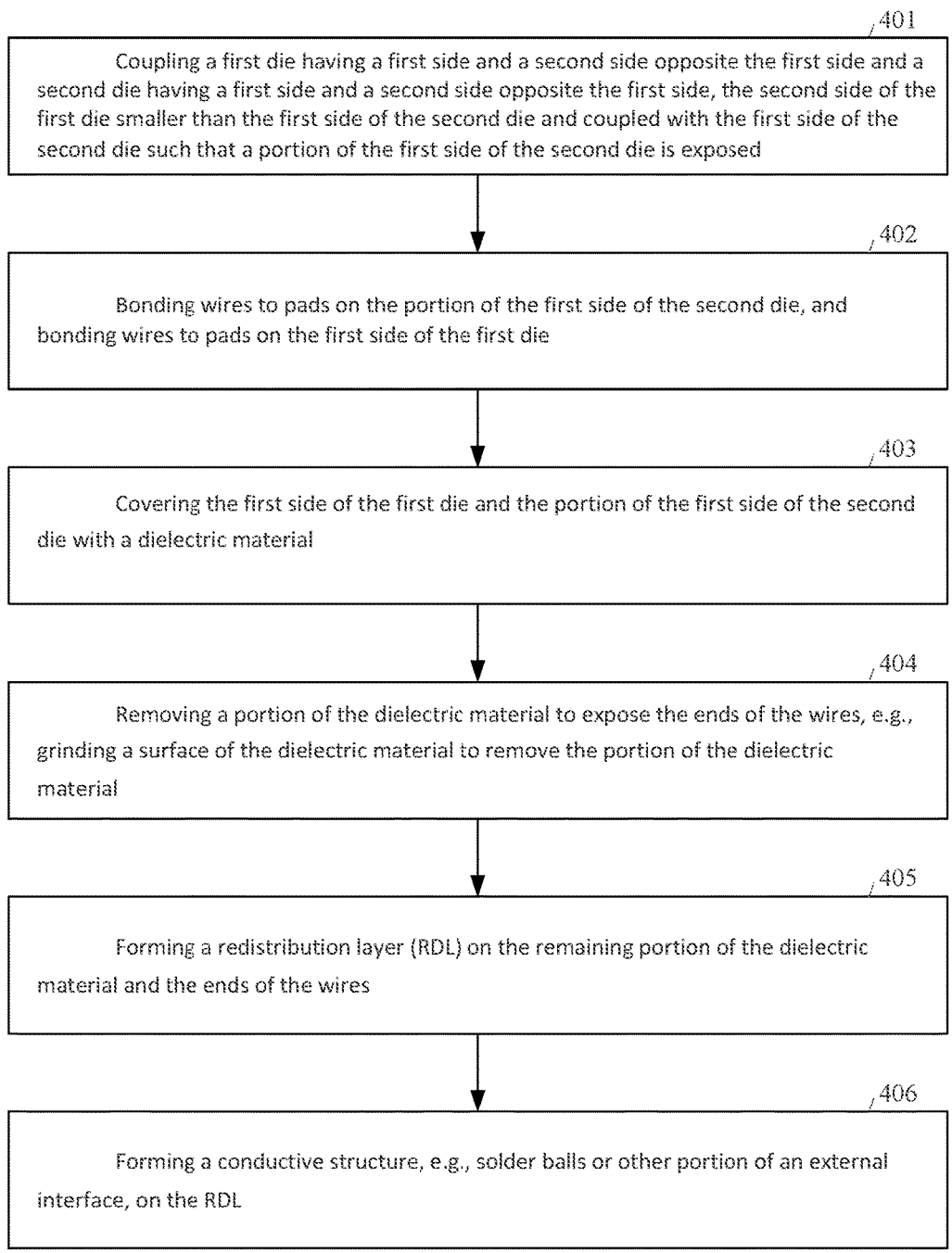
FIG. 5 illustrates a process for forming integrated circuit packaging for a stack of semiconductor dice of different sizes.

FIG. 5 illustrates a process 400 for forming integrated circuit packaging for a stack of semiconductor dice of different sizes. In some embodiments, one of the dice may be similar to die 110 (FIG. 1) and another one of the dice may be similar to die 120 (FIG. 1).

Block 401 of process 400 may include coupling a first die having a first side and a second side opposite the first side and a second die having a first side and a second side opposite the first side. The second side of the first die is smaller than the first side of the second die and coupled with the first side of the second die such that a portion of the first side of the second die is exposed. Block 402 may include bonding wires to pads on the portion of the first side of the second die, and bonding wires to pads on the first side of the first die.

The process 400 may include covering the first side of the first die and the portion of the first side of the second die with a dielectric material in block 403. A portion of the dielectric material may be removed to expose the ends of the wires in block 404. In some embodiments, removal may include grinding a surface of the dielectric material to remove the portion of the dielectric material to expose ends of the wires at a first side of the casing opposite a second side that is directly adjacent to the first die and the second die. The grinding may be down to the ends of the wires. For instance, ends of the wires may be polished and/or scored, e.g., partially polished or scored, by the grinding.

In block 405, a conductive layer such as a redistribution layer (RDL) may be formed on the remaining portion of the dielectric and the ends of the wires. The RDL may couple selected connections of the first die to selected connections of the second die. A first side of the RDL may be directly adjacent to the ends of the wires and a second side that is opposite the first side may include conductive regions. These conductive regions may be referred to herein as "pads" of the second side of the RDL. In some examples, these pads may be coplanar with a dielectric region of the second side of the RDL.

The process 400 may include forming a conductive structure (e.g., solder balls or other portion of an external interface) on the RDL (e.g., on the pads of the RDL) to provide an interconnect between at least one of the dice and an external device in block 406. In some embodiments, solder balls to couple the multichip package to a circuit board, e.g., a printed circuit board (PCB) of an external device, may be formed on the pads of the second side of the RDL.

In contrast with the wirebond approach using a PCB with bond fingers surrounding a stack of chips with wires draped down from a chip to the bond fingers, a multichip package formed using process 400 may have xy dimensions, that are lateral dimensions measured in a plane parallel to the first face or second face of one of the above-described die, that may correspond to the surface area of the side of die farthest from the RDL. In some examples, the xy dimensions of the package may be the same as the surface area of the side of die farthest from the RDL. Also, in contrast with the wirebond approach using a PCB with bond fingers, a multichip package formed using process 400 may not require a substrate such as the PCB.

Referring again to FIG. 1, in some embodiments, at least one of the first die 110 or the second die 120 is a field-programmable gate array (FPGA) including logic silicon, which may involve different bond density than other examples (e.g., greater bond density), e.g., memory die stacking of same memory dice. With the bond density associated with logic silicon, the bond pads 111 and 121 may be arranged on more than one side of the first die 110 and the second die 120. In this particular example, a 4-sided bond pad arrangement is shown for each of the first die 110 and the second die 120. In some embodiments, one of the die of a multichip package may include an N-sided bond pad arrangement and another dice of the multichip package may include an X-side bonded pad arrangement, where X and N may be different values and at least one of X or N may be more than one.

In the illustrated example, the first die 110 and the second die 120 have a same geometry, but different dimensions (e.g., different area of the coupled sides). In some embodiments, differently sized dice in a stack may have different geometries, for instance, a square side of one die may couple to a rectangular side of another die. In some embodiments, a rectangular sided die having a long edge that is equal in length to the edges of a square sided die may be coupled to a side of the square sided die to expose a portion of that side of the square sided die. The rectangular sided die may be centered on the square sided die to expose two separate portions of the square side. In any embodiment, a thickness of one die of the stack may be different than a thickness of another die of the stack.

In the illustrated example, the stack includes two dice. However, in other examples a stack may include any number of dice, for instance 2-4 or more dice. Dice sizing in the stack may be completely heterogeneous (in a stack of square sided dice of completely heterogeneous sizing the largest die may be on one end of a pyramid-shaped stack followed by successively smaller dice to a smallest die on the other end of the pyramid-shaped stack), or partially heterogeneous (a subset of two or more dice of the stack have a same size). Also, functions of the dice in the stack may be completely heterogeneous (e.g., a unique functionality for each die in the stack), or partially heterogeneous (where a subset of two or more dice have a same non-unique functionality, such as memory).

In a partially heterogeneous sized stack, one or more dice of one end of the stack may be logic silicon (which may be of different sizes if more than one), and dice of another end of the stack may include two or more of the same type of memory die of the same size each having bond pads on only one or two sides. The two or more memory dice that each have bond pads on only one or two sides may be arranged into shingles (with overhangs) to expose the bond pads bands so that wires may be attached thereto. The two or more memory dice may have non-unique functionality, e.g., all may be memory. The stack may include any combination of logic/memory dice, such as NAND (not logical AND), DRAM (dynamic random access memory), 3D XPoint (three dimensional crosspoint), SoC (system-on-a-chip), FPGA (i.e. multichip), or the like, and combinations thereof.

Although the examples described herein utilize a wire, other examples may utilize any elongated conductive structure that is capable of remaining erect, e.g., fully erect, for a period of time after formation or attachment, where the period of time is one that is sufficient to apply a molding in order to fix a position of the conductive structure relative to die surface. Such elongated conductive structure may include a conductive column, conductive post, or the like, or combination thereof, that is on, e.g., attached to or formed on, a surface.

A length of the longest wires in a multichip package formed according to process 400 (FIG. 5) may be on the order of approximately 500 um, versus a length of wires using in draping, which may be approximately 2-3 mm. The reduced length may improve signal integrity as compared to draped wire approaches.

In some examples, wires may extend from an exposed portion of a larger die to the RDL, and other conductive structures (such as pads or the like, which may not necessarily be elongated) may be located between a side of the smaller die and the RDL. Referring again to the wires, a length of the wires in a two-die stack may be a thickness of the smaller die (thickness referring to a measurement of a distance between the aforementioned sides of the such die) plus an additional length corresponding to a thickness of a thin portion of the molding between the RDL and the side of the smaller die (thickness here referring to a measurement of a distance between a side of the casing that is directly adjacent to the smaller die and an opposite side of the casing). A length of the conductive structures located between a side of the smaller die and the RDL may be equal to this additional length. In some embodiments, these conductive structures may be part of the RDL. For instance, the RDL may include pads similar to the pads between the dielectric 151 (FIG. 5) on both sides of the RDL. The pads on the side of the RDL closest to the smaller die may directly contact selected pads of the smaller die.

In some examples, a count of interconnects (including chip-to-chip and/or device-to-device interconnects) provided by the RDL may be on the order of at least hundreds or thousands, and a count of wires extending from surfaces of the dice may be on the order of at least hundreds or thousands. The RDL and the wires may route signals from 1) chip to chip, 2) chip to the external interface on the opposite side of the RDL as the stack and/or 3) chip to an external interface on a same side of the RDL as the stack (in such a case there may be more than one multichip stack connected to a same RDL).

Figure 6:
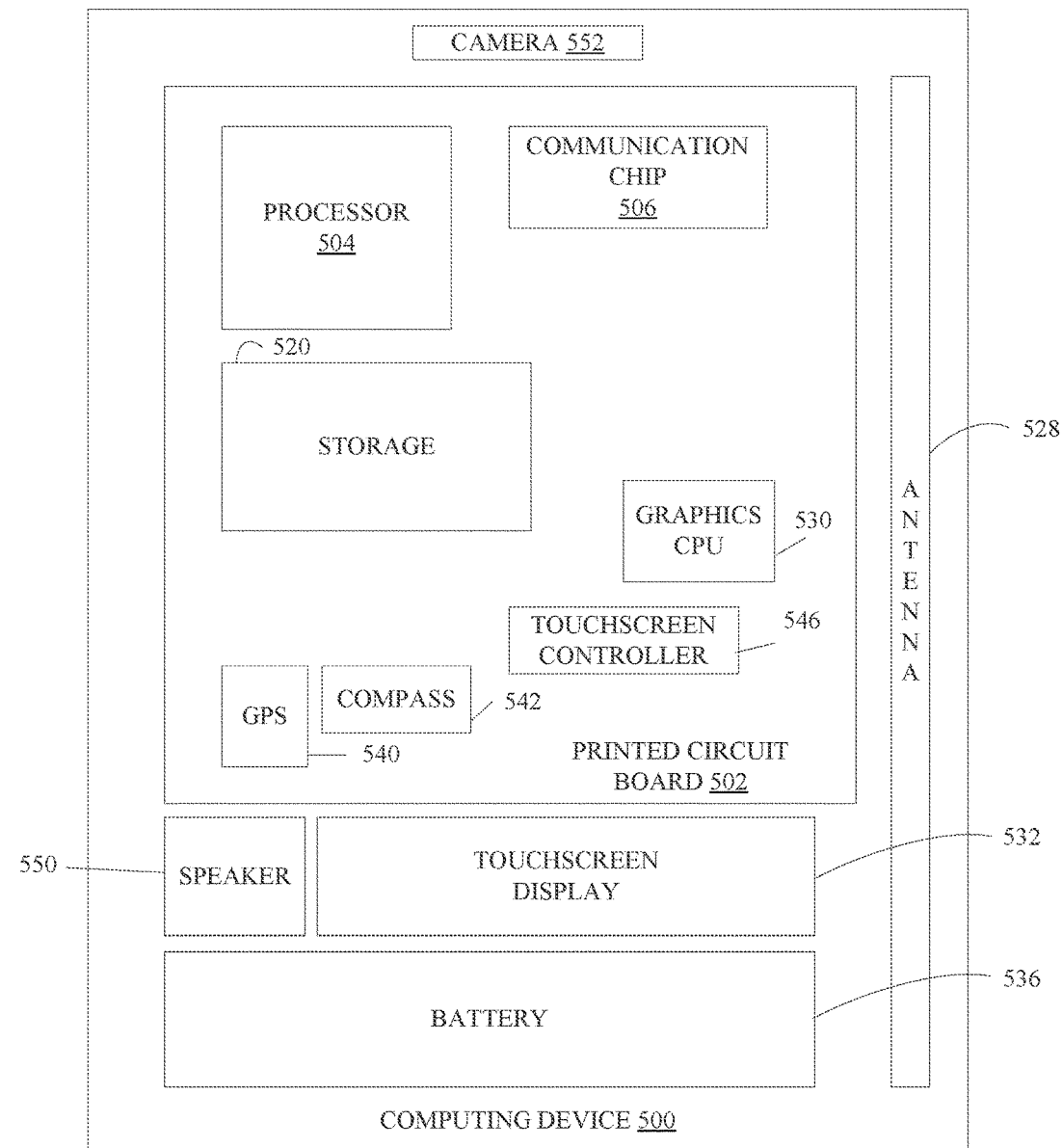
FIG. 6 illustrates an example computing device that may employ the apparatuses and/or methods described herein, according to various embodiments.

FIG. 6 illustrates an example computing device 500 that may employ the apparatuses and/or methods described herein, according to various embodiments. In various embodiments, any of the components, for instance storage 520 (e.g., a non-volatile storage (such as a solid state drive) having a two or more chip field-programmable gate array architecture), may be a first device of the multichip package technology earlier described with references to FIGS. 1-5. The first device may have a single semiconductor package for a stack of differently-sized semiconductor dice of the first device. In various embodiments, computing device 500 may include printed circuit board (PCB) 502; however, in alternate embodiments, the various components may be coupled without the employment of PCB 502. In various embodiments, any of the components such as the storage 520 may be physically and electrically coupled the printed circuit board (PCB) 502 and electrically coupled to some other device through the PCB 502, or physically and electrically coupled directly to the other device in embodiments without PCB 502, via an external interface of the first device.

Depending on its applications, computing device 500 may include other components that may or may not be physically and electrically coupled to the PCB 502. These other components may include one or more processor(s) 504 (one shown), at least one communication chip 506. In further implementations, the communication chip 506 may be part of the one or more processor(s) 504. For these embodiments, the one or more processor(s) 504 and communication chip 506 may be disposed thereon. These components include, but are not limited to, a memory controller (not shown), volatile memory (e.g., dynamic random access memory (DRAM), not shown), an additional non-volatile memory such as read only memory (ROM) (not shown), flash memory (not shown), an I/O controller (not shown), a digital signal processor (not shown), a crypto processor (not shown), a graphics processor 530, one or more antenna 528, a display (not shown), a touch screen display 532, a touch screen controller 546, a battery 536, an audio codec (not shown), a video codec (not shown), a global positioning system (GPS) device 540, a compass 542, an accelerometer (not shown), a gyroscope (not shown), a speaker 550, a camera 552, and a mass storage device (such as hard disk drive, a solid state drive, compact disk (CD), digital versatile disk (DVD)) (not shown), and so forth. As mentioned previously, any of these components may be a first device of the multichip package technology earlier described with references to FIGS. 1-5.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 5G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

EXAMPLES

Example 1 is an apparatus including a multichip package, the apparatus comprising a first die having a first side and a second side opposite the first side; a second die having a first side and a second side opposite the first side, the second side of the first die is smaller than the first side of the second die and coupled with the first side of the second die such that a portion of the first side of the second die is exposed; a first plurality of wires coupled with and extending from the portion of the first side of the second die; a second plurality of wires coupled with and extending from first side of the first die; a casing surrounding the first and second plurality of wires and covering the first side of the first die and the portion of the first side of the second die, wherein ends of the first and second plurality of wires are exposed at a first side of the casing opposite a second side that is directly adjacent to the first and second die; and a redistribution layer (RDL) coupled with the first side of the casing and electrically coupled with the first and second plurality of wires.

Example 2 includes the subject matter of example 1, and the RDL electrically connects at least one wire of the first plurality of wires and at least one wire of the second plurality of wires.

Example 3 includes the subject matter of any of examples 1-2, and an external interface electrically connected to the RDL.

Example 4 includes the subject matter of any of examples 1-3, and the first side of the casing is smooth and the exposed ends of the first and second wires are scored or polished.

Example 5 includes the subject matter of any of examples 1-4, and the first plurality of wires are bonded to pads on the portion of the first side of the second die.

Example 6 includes the subject matter of any of examples 1-5, and the second plurality of wires are bonded to pads on the first side of the first die.

Example 7 includes the subject matter of any of examples 1-6, and the first plurality of wires is longer than the second plurality of wires.

Example 8 includes the subject matter of any of examples 1-7, and end portions of the first plurality and second pluralities of wires that include said ends of the first and second pluralities of wires are perpendicular with the RDL.

Example 9 includes the subject matter of any of examples 1-8, and end portions of the other ends of the first and second pluralities of wires are perpendicular with the first side of the first die and the first side of the second die, respectively.

Example 10 includes the subject matter of any of examples 1-9, and the ends of the first and second pluralities of wires are coplanar with the first side of the casing.

Example 11 includes a method of multichip packaging, the method comprising coupling a first die having a first side and a second side opposite the first side and a second die having a first side and a second side opposite the first side, wherein the second side of the first die is smaller than the first side of the second die and coupled with the first side of the second die such that a portion of the first side of the second die is exposed; forming a casing surrounding first wires extending from the portion of the first side of the second die and second wires extending from first side of the first die and covering the first side of the first die and the portion of the first side of the second die, wherein ends of the first and second plurality of wires are exposed at a first side of the casing opposite a second side that is directly adjacent to the first and second die; and forming a redistribution layer (RDL) coupled with the first side of the casing and electrically coupled with the first and second plurality of wires.

Example 12 includes the subject matter of example 11, and bonding the first plurality of wires to pads on the portion of the first side of the second die; and bonding the second plurality of wires to pads on the first side of the first die.

Example 13 includes the subject matter of any of examples 11-12, and forming the casing further comprises: covering the first side of the first die and the portion of the first side of the second die with a dielectric material; and removing a portion of the dielectric material to expose the ends of the first and second plurality of wires.

Example 14 includes the subject matter of any of examples 11-13, and grinding a surface of the dielectric material to remove the portion of the dielectric material.

Example 15 includes the subject matter of any of examples 11-14, and forming solder balls on pads of the RDL.

Example 16 is a system including a multichip package, the method comprising a first device having a single semiconductor package for a stack of differently-sized semiconductor dice of the first device, wherein a dimension of a first semiconductor die of the stack is greater than a dimension of a second semiconductor die of the stack that is next to the first semiconductor die in the stack such that the second semiconductor die exposes a surface of the first semiconductor die, wherein the single semiconductor package includes a casing surrounding wires that extend from the exposed surface of the first semiconductor die to at least a plane that is coplanar with an end of the stack; and a second device coupled to at least one of the wires via an external interface of the semiconductor package.

Example 17 includes the subject matter of example 16, and the external interface affixes the first device to a circuit board of the second device.

Example 18 includes the subject matter of any of examples 16-17, and at least one of the wires provides an electrical connection between the first semiconductor die and the second semiconductor die.

Example 19 includes the subject matter of any of examples 16-18, and at least one of the wires provides an electrical connection between the external interface and at least one of the first semiconductor die or the second semiconductor die.

Example 20 includes the subject matter of any of examples 16-19, and the casing surrounds wires that extend from a surface of the second semiconductor die.

Example 21 is an apparatus, including a multichip package, the apparatus comprising: means for encapsulating sides of wires extending away from a surface of a first semiconductor die of a stack of differently-sized semiconductor dice; wherein said surface is exposed by a second semiconductor die that is smaller than the first semiconductor die and next to the first semiconductor die in the stack; and means for connecting an exposed end of at least one of the wires to an exposed end of at least one of wires extending away from an exposed surface of the second semiconductor die.

Example 22 includes the subject matter of example 21, and means for attaching an external electrical interface of the apparatus to a circuit board.

Example 23 includes the subject matter of any of examples 21-22, and the encapsulation means exposes ends of the wires.

Example 24 includes the subject matter of any of examples 21-23, and the ends of the wires and the encapsulation means are coplanar.

Example 25 includes the subject matter of any of examples 21-24, and means for attaching the wires to the exposed surfaces of the first and second semiconductor dice.

What is claimed is:

1. An apparatus comprising:
 a first die having a first side and a second side opposite the first side;
 a second die having a first side and a second side opposite the first side, the second side of the first die is smaller than the first side of the second die and coupled with the first side of the second die such that a portion of the first side of the second die is exposed;
 a first plurality of elongated conductive structures coupled with and extending from first bond pads on the portion of the first side of the second die, wherein each elongated conductive structure of the first plurality of elongated conductive structures includes a first end and a second end, wherein the first end is bonded to a respective one of the first bond pads;
 a second plurality of elongated conductive structures coupled with and extending from second bond pads on the first side of the first die, wherein each elongated conductive structure of the second plurality of elongated conductive structures includes a first end and a second end, wherein the first end is bonded to a respective one of the second bond pads;
 a casing surrounding the elongated conductive structures and covering the first side of the first die and the portion of the first side of the second die, wherein respected second ends of the first and second elongated conductive structures are exposed at a first side of the casing opposite a second side that is directly adjacent to the first and second die;
a redistribution layer (RDL) coupled with the first side of the casing and electrically coupled with at least some of the respective second ends of the first and second plurality of elongated conductive structures, wherein the RDL includes a dielectric layer and one or more conductive regions, wherein the conductive regions include protrusions with surfaces disposed coplanar with a surface of the dielectric layer; and
one or more conductive structures disposed on top of respective protrusions of the conductive regions of the RDL, to provide an interface between the apparatus and an external device.

2. The apparatus of claim 1, wherein the RDL electrically connects at least one elongated conductive structure of the first plurality of elongated conductive structures and at least one elongated conductive structure of the second plurality of elongated conductive structures.

3. The apparatus of claim 1, further comprising an external interface electrically connected to the RDL.

4. The apparatus of claim 1, wherein the first side of the casing is smooth and the exposed second ends of the first and second pluralities of elongated conductive structures are scored or polished.

5. The apparatus of claim 1, wherein the first plurality of elongated conductive structures is longer than the second plurality of elongated conductive structures.

6. The apparatus of claim 1, wherein end portions of the first and second pluralities of elongated conductive structures that include respective first and second ends are perpendicular with the RDL.

7. The apparatus of claim 6, wherein end portions of the first ends of the first and second pluralities of elongated conductive structures are perpendicular with the first side of the first die and the first side of the second die, respectively.

8. The apparatus of claim 1, wherein the second ends of the first and second pluralities of elongated conductive structures are coplanar with the first side of the casing.

* * * * *

UNITED STATES PATENT AND TRADEMARK OFFICE
CERTIFICATE OF CORRECTION

PATENT NO. : 10,204,884 B2
APPLICATION NO. : 15/197494
DATED : February 12, 2019
INVENTOR(S) : Saeed S. Shojaie Page 1 of 1

It is certified that error appears in the above-identified patent and that said Letters Patent is hereby corrected as shown below:

In the Claims

Column 10
Line 67, "...respected..." should read – "...respective..."

Signed and Sealed this
Twenty-first Day of May, 2019

Andrei Iancu
*Director of the United States Patent and Trademark Office*